(12) United States Patent
Du

(10) Patent No.: US 9,179,576 B2
(45) Date of Patent: Nov. 3, 2015

(54) COMPUTER POWER SUPPLY

(75) Inventor: Jianjun Du, Shenzhen (CN)

(73) Assignee: SHENZHEN FLUENCE TECHNOLOGY PLC., Shenzhen, Guangdong Province (CN)

( * ) Notice: Subject to any disclaimer, the term of this patent is extended or adjusted under 35 U.S.C. 154(b) by 300 days.

(21) Appl. No.: 13/699,621

(22) PCT Filed: Jul. 22, 2010

(86) PCT No.: PCT/CN2010/075386
§ 371 (c)(1),
(2), (4) Date: Nov. 21, 2012

(87) PCT Pub. No.: WO2011/147112
PCT Pub. Date: Dec. 1, 2011

(65) Prior Publication Data
US 2013/0070417 A1    Mar. 21, 2013

(30) Foreign Application Priority Data

May 24, 2010 (CN) .......................... 2010 1 0180717

(51) Int. Cl.
*H05K 7/20* (2006.01)
*G06F 1/20* (2006.01)
*G06F 1/26* (2006.01)
*H01L 23/473* (2006.01)

(52) U.S. Cl.
CPC .............. *H05K 7/20145* (2013.01); *G06F 1/20* (2013.01); *G06F 1/26* (2013.01)

(58) Field of Classification Search
CPC ...................... H05K 7/20218–7/20381; H05K 7/20409–7/20418; H05K 7/20009–7/202; H01L 23/473; H01L 23/367–23/3677; H01L 23/46–23/467; G06F 1/181–1/182

USPC ............ 361/679.46–679.54, 688–723, 361/676–678; 165/80.1–80.5, 104.33, 185; 174/15.1–15.2, 16.1–16.3, 521, 526, 174/547–548, 15.1–15.3; 454/184; 257/712–722, E23.088; 363/151; 312/236
See application file for complete search history.

(56) References Cited

U.S. PATENT DOCUMENTS

| | | | | |
|---|---|---|---|---|
| 5,694,295 A | * | 12/1997 | Mochizuki et al. | 361/699 |
| 5,917,698 A | * | 6/1999 | Viallet | 361/695 |
| 6,061,237 A | * | 5/2000 | Sands et al. | 361/695 |
| 6,094,346 A | * | 7/2000 | Schweers et al. | 361/695 |
| 6,183,214 B1 | * | 2/2001 | Ko | 417/360 |
| 6,295,202 B1 | * | 9/2001 | Tucker et al. | 361/704 |

(Continued)

FOREIGN PATENT DOCUMENTS

| | | |
|---|---|---|
| CN | 2515797 Y | 10/2002 |
| CN | 1378407 A | 11/2002 |

(Continued)

*Primary Examiner* — Anthony Haughton
*Assistant Examiner* — Razmeen Gafur
(74) *Attorney, Agent, or Firm* — Cheng-Ju Chiang

(57) ABSTRACT

A computer power supply of the present disclosure comprises a housing, a circuit board disposed inside the housing and a fan assembly for dissipating heat from the circuit board, and the fan assembly is disposed obliquely with respect to a surface of the circuit board. With the aforesaid structure, the air produced by the fan assembly of the computer power supply of the present disclosure acts on the circuit board obliquely, and flows out in one direction after dissipating heat from a component that is to be cooled, so the heat dissipation effect is improved.

3 Claims, 2 Drawing Sheets

(56) References Cited

U.S. PATENT DOCUMENTS

| | | | |
|---|---|---|---|
| 6,813,152 B2 * | 11/2004 | Perazzo | 361/695 |
| 7,002,798 B2 * | 2/2006 | Seki et al. | 361/695 |
| 7,773,369 B2 * | 8/2010 | Dornauer et al. | 361/676 |
| 7,891,864 B2 * | 2/2011 | Yazawa et al. | 374/29 |
| 7,909,087 B2 * | 3/2011 | Kimura et al. | 165/80.3 |
| 7,916,481 B2 * | 3/2011 | Thome et al. | 361/699 |
| 7,990,700 B2 * | 8/2011 | Guo | 361/679.48 |
| 8,050,029 B1 * | 11/2011 | Kam et al. | 361/679.49 |
| 8,243,445 B2 * | 8/2012 | Hasegawa et al. | 361/690 |
| 8,300,409 B2 * | 10/2012 | Wei et al. | 361/690 |
| 8,379,384 B2 * | 2/2013 | Smalen et al. | 361/679.51 |
| 8,462,501 B2 * | 6/2013 | Silvennoinen et al. | 361/695 |
| 8,817,470 B2 * | 8/2014 | Aoki et al. | 361/690 |
| 2005/0143001 A1 * | 6/2005 | Merlet et al. | 454/184 |
| 2005/0145366 A1 * | 7/2005 | Erel | 165/80.3 |
| 2006/0169438 A1 * | 8/2006 | Malone et al. | 165/80.4 |
| 2007/0230118 A1 * | 10/2007 | Leija et al. | 361/690 |
| 2009/0154092 A1 * | 6/2009 | Chen | 361/679.51 |
| 2013/0229774 A1 * | 9/2013 | Chen et al. | 361/695 |

FOREIGN PATENT DOCUMENTS

| | | |
|---|---|---|
| CN | 2735425 Y | 10/2005 |
| CN | 201029218 Y | 2/2008 |

* cited by examiner

COMPUTER POWER SUPPLY

CROSS REFERENCE TO RELATED APPLICATIONS

The present application is a 35 U.S.C. §371 National Phase conversion of International (PCT) Patent Application No. PCT/CN2010/075386, filed on Jul. 22, 2010, the disclosure of which is incorporated by reference herein. The PCT International Patent Application was published in Chinese.

FIELD OF THE INVENTION

The present disclosure relates to a computer power supply.

BACKGROUND OF THE INVENTION

With development of the science and technologies, computers have become indispensible to people's daily life. As has been known, there are mainly two kinds of structures for power supplies disposed in the computers. As shown in FIG. 1, a power supply 10 comprises a housing 11, a circuit board 12 and a fan assembly 13. The circuit board 12 is disposed inside the housing 11, and is adapted to bear an electronic component 121 necessary for operation of the power supply 10. The housing 11 has an air outlet 14 disposed at a side thereof. The fan assembly 13 is disposed perpendicular to a surface of the circuit board 12, and the air produced by the fan assembly 13 acts on the circuit board 12 in parallel in a direction D1. After absorbing heat from the electronic component 121 on the circuit board 12, the air produced by a fan body 131 becomes hot air, which then flows out in a direction D4 via the air outlet 14. China Patent No. ZL200420082974.0 discloses a similar embodiment. However, because the air produced by the fan assembly 13 flows from one side to the other side of the circuit board 12, the air will have a poor effect of dissipating heat from the electronic component 121 when flowing to the side away from the fan assembly 13.

As shown in FIG. 2, a power supply 20 comprises a housing 21, a circuit board 22 and a fan assembly 23. The circuit board 22 is disposed inside the housing 21, and is adapted to bear an electronic component 221 necessary for operation of the power supply 20. The housing 21 has an air outlet 24 disposed at a side thereof. The fan assembly 23 and the circuit board 22 are disposed opposite to each other inside the housing 21. The air produced by the fan assembly 23 acts on the circuit board 22 perpendicularly in a direction D2. However, after having cooled the electronic component 221 on the circuit board 22, the air produced by the fan assembly 23 cannot completely flow out in the direction D4 via the air outlet 24; and instead, a part of the air is bounced back intensively, which has a great influence on the heat dissipation effect.

SUMMARY OF THE INVENTION

In order to dissipate heat from the computer power supply more efficiently, the present disclosure provides a computer power supply.

The computer power supply of the present disclosure comprises a housing, a circuit board disposed inside the housing and a fan assembly for dissipating heat from the circuit board. The housing comprises a bottom wall, and a first sidewall and a second sidewall that are disposed opposite to each other and connected with the bottom wall, the circuit board is disposed on the bottom wall, the fan assembly is disposed on the second sidewall, and the second sidewall is disposed obliquely with respect to the bottom wall, thus the fan assembly is disposed obliquely with respect to a surface of the circuit board, in such a way that the air blowing from the fan assembly is oblique act on the circuit board.

According to a preferred embodiment of the present disclosure, the first sidewall is provided with an air outlet, and the second sidewall is provided with an air inlet.

According to a preferred embodiment of the present disclosure, an oblique angle of the second sidewall with respect to the surface of the circuit board is identical to an oblique angle of the fan assembly with respect to the surface of the circuit board.

According to a preferred embodiment of the present disclosure, the oblique angle is 30°~60°.

According to a preferred embodiment of the present disclosure, the fan assembly comprises a fan body and a fan frame, the fan body is accommodated in the fan frame, and the fan frame is fixed to the second sidewall in such a way that the fan assembly is disposed obliquely with respect to the surface of the circuit board.

The computer power supply of the present disclosure comprises a housing, a circuit board disposed inside the housing, an electronic component disposed on a surface of the circuit board, and a fan assembly for dissipating heat from the circuit board. An air blowing direction of the fan assembly is oblique with respect to the surface of the circuit board.

According to a preferred embodiment of the present disclosure, the housing comprises a bottom wall, and a first sidewall and a second sidewall that are disposed opposite to each other and connected with the bottom wall, the first sidewall is provided with an air outlet, the second sidewall is provided with an air inlet, the circuit board is disposed on the bottom wall, and the fan assembly is disposed on the second sidewall.

According to a preferred embodiment of the present disclosure, the second sidewall is disposed obliquely with respect to the surface of the circuit board, the fan assembly comprises a fan body and a fan frame, the fan body is accommodated in the fan frame, and the fan frame is fixed to the second sidewall in such a way that the air blowing direction of the fan assembly is oblique with respect to the surface of the circuit board.

According to a preferred embodiment of the present disclosure, the fan body pivots about a rotary shaft located at a center thereof, and a direction in which the rotary shaft extends is parallel to the air blowing direction of the fan assembly.

With the aforesaid structure, the air produced by the fan assembly of the computer power supply of the present disclosure acts on the circuit board obliquely, and flows out in one direction after dissipating heat from the component that is to be cooled, so the heat dissipation effect is improved.

DETAILED DESCRIPTION OF THE INVENTION

Hereinbelow, the present disclosure will be described in detail with reference to the attached drawings and embodiments thereof.

Figure 1:
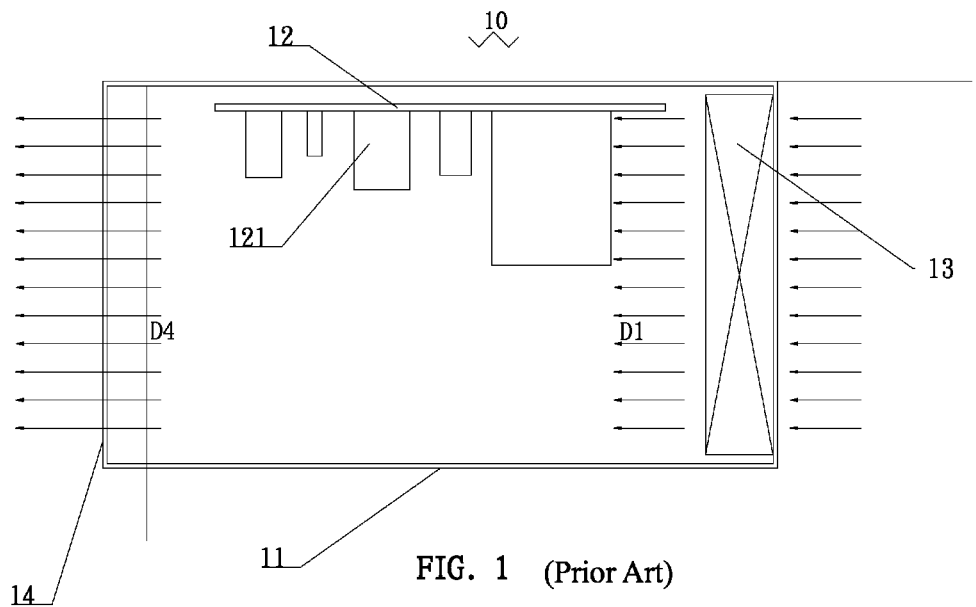
FIG. 1 is a schematic structural view of a prior art computer power supply.
Figure 2:
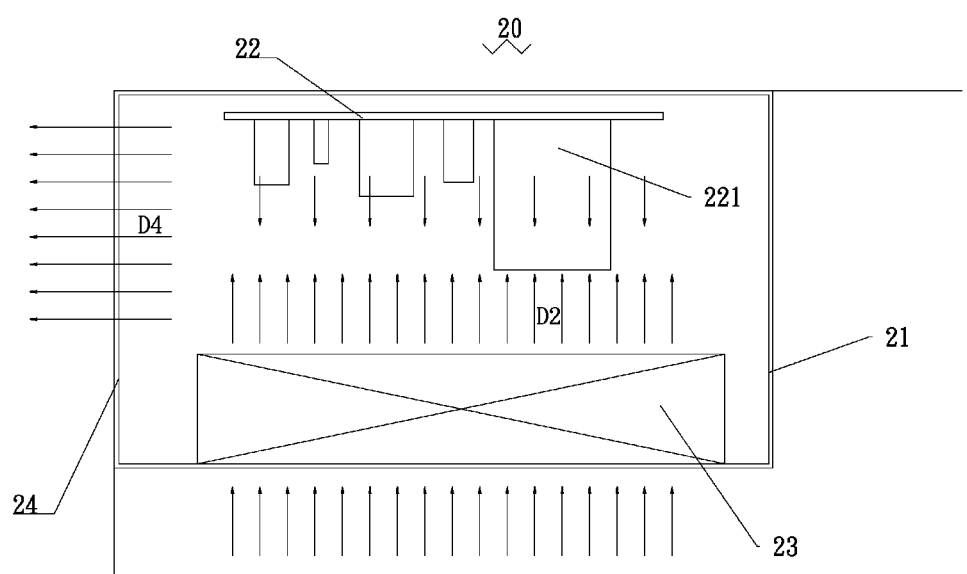
FIG. 2 is a schematic structural view of another prior art computer power supply.
Figure 3:
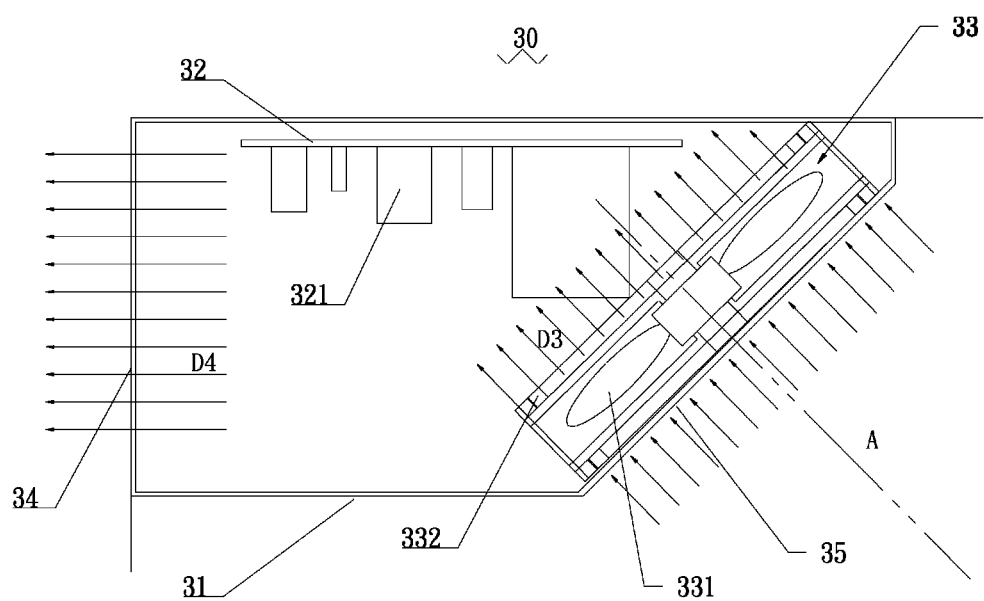
FIG. 3 is a schematic structural view of a computer power supply according to a preferred embodiment of the present disclosure.

As shown in FIG. 3, in a preferred embodiment of the present disclosure, a computer power supply 30 comprises a housing 31, a circuit board 32 disposed inside the housing 31 and a fan assembly 33 for dissipating heat from the circuit board 32. An electronic component 321 necessary for operation of the computer power supply 30 is disposed on a surface of the circuit board 32.

As shown in FIG. 3, the housing 31 comprises a bottom wall, and a first sidewall and a second sidewall that are disposed opposite to each other and connected with the bottom wall. The circuit board 32 is disposed on the bottom wall, the first sidewall is provided with an air outlet 34, and the second sidewall opposite to the first sidewall is provided with an air inlet 35. In this embodiment, the fan assembly 33 is disposed obliquely with respect to the surface of the circuit board 32 in such a way that an air blowing direction D3 of the fan assembly 33 is oblique with respect to the surface of the circuit board 32. Specifically, the fan assembly 33 is disposed on the second sidewall which is disposed obliquely with respect to the circuit board 32, and an oblique angle of the second sidewall with respect to the surface of the circuit board 32 is identical to an oblique angle of the fan assembly 33 with respect to the surface of the circuit board 32; i.e., the fan assembly 33 and the second sidewall of the housing 31 on which the fan assembly 33 is disposed are parallel to each other. In this embodiment, the fan assembly 33 comprises a fan body 331 and a fan frame 332, the fan body 331 is accommodated in the fan frame 332, and the fan frame 332 is fixed to the second sidewall. The fan body 331 pivots about a rotary shaft A located at a center thereof and a direction in which the rotary shaft A extends and the air blowing direction D3 of the fan assembly 33 are parallel to each other, and are both oblique with respect to the surface of the circuit board 32 on which the electronic component is installed. Thereby, the fan assembly 33 and the air blowing direction thereof are oblique with respect to the surface of the circuit board 32 on which the electronic component is installed. Generally speaking, the most preferred oblique angle is 30°~60°.

As shown in FIG. 3, when the computer power supply 30 operates, the circuit board 32 and the fan assembly 33 operate simultaneously. However, because the fan assembly 33 is disposed obliquely, the air blown from the fan assembly 33 flows in the direction D3 and then acts on the circuit board 32 obliquely. Therefore, after the cool air dissipates heat from the circuit board 32, the heated air directly flows out in a direction D4 via the air outlet 34 instead of cycling inside the power supply 30. Thereby, a good heat dissipation effect is achieved.

With the aforesaid structure, the air produced by the fan assembly acts on the circuit board obliquely, and flows out in one direction after dissipating heat from a component that is to be cooled, so the heat dissipation effect is improved.

Thus, the present disclosure has been described exemplarily in the aforesaid embodiments. However, on the basis of the above descriptions, people skilled in the art can make various modifications to the present disclosure without departing from the spirit and scope of the present disclosure.

What is claimed is:

1. A computer power supply, comprising a housing, a circuit board disposed inside the housing and a fan assembly for dissipating heat from the circuit board, wherein the housing comprises a bottom wall, and a first sidewall and a second sidewall that are disposed opposite to each other and connected with the bottom wall, the circuit board is disposed on the bottom wall, the fan assembly is disposed on a surface of the second sidewall, the surface is towards the circuit board and the second sidewall is disposed obliquely with respect to the bottom wall, thus the fan assembly is disposed obliquely with respect to a surface of the circuit board, in such a way that the air blowing from the fan assembly is oblique act on the circuit board;

wherein the first sidewall is provided with an air outlet, and the second sidewall is provided with an air inlet;

an oblique angle of the second sidewall with respect to the surface of the circuit board is identical to an oblique angle of the fan assembly with respect to the surface of the circuit board;

the fan assembly comprises a fan body and a fan frame, the fan body is accommodated in the fan frame, and the fan frame is fixed to the second sidewall in such a way that the fan assembly is disposed obliquely with respect to the surface of the circuit board.

2. The computer power supply of claim 1, wherein the oblique angle is 30°~60°.

3. The computer power supply of claim 1, wherein there is an obtuse angle between air blowing direction of an air inlet and air blowing direction of an air outlet.

* * * * *